(12) United States Patent
Mordakhay et al.

(10) Patent No.: US 10,871,404 B2
(45) Date of Patent: Dec. 22, 2020

(54) MINIATURIZED THERMISTOR BASED THERMAL SENSOR

(71) Applicant: Birad—Research & Development Company Ltd., Ramat Gan (IL)

(72) Inventors: Anatoli Mordakhay, Hadera (IL); Joseph Shor, Tel Mond (IL)

(73) Assignee: Birad—Research & Development Company Ltd., Ramat Gan (IL)

( * ) Notice: Subject to any disclaimer, the term of this patent is extended or adjusted under 35 U.S.C. 154(b) by 238 days.

(21) Appl. No.: 15/981,014

(22) Filed: May 16, 2018

(65) Prior Publication Data

US 2019/0353534 A1    Nov. 21, 2019

(51) Int. Cl.
G01K 1/14     (2006.01)
G01K 7/22     (2006.01)
H01L 23/34    (2006.01)

(52) U.S. Cl.
CPC .............. *G01K 7/226* (2013.01); *H01L 23/34* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,275,157 A | * | 1/1994 | Morgan | A61N 1/39 374/E1.022 |
| 5,563,495 A | * | 10/1996 | Tomiyori | H02J 7/008 320/153 |
| 8,331,203 B2 | * | 12/2012 | La Rosa | G11C 27/005 324/658 |
| 9,182,295 B1 | * | 11/2015 | Perrott | G01K 7/226 |
| 2008/0169826 A1 | * | 7/2008 | Bartling | G01R 31/3167 324/658 |
| 2013/0121372 A1 | * | 5/2013 | Wenn | G01K 7/22 374/102 |

* cited by examiner

*Primary Examiner* — Stephen D Meier
*Assistant Examiner* — Nasir U. Ahmed
(74) *Attorney, Agent, or Firm* — Dekel Patent Ltd.; David Klein

(57) ABSTRACT

A thermal sensor includes a first resistor and a first capacitor. The first resistor is a thermistor. A first current source is coupled to the first resistor and the first capacitor. The first current source alternately charges the first resistor and the first capacitor each to a reference voltage, $V_{therm}$. An output of the thermal sensor is a function of a resistance-capacitance (RC) time constant of the first resistor and the first capacitor.

10 Claims, 12 Drawing Sheets

| Source | This work | This work | [11] VLSI 2014 | [13] JSSC 2010 | [14] JSSC 2014 | [15] ESSCIRC 2014 | [7] ISSCC 2016 | [16] VLSI 2016 | [6] ISCAS 2010 |
|---|---|---|---|---|---|---|---|---|---|
| Type | Res | Res | Res | Res | Res | Res | TD | BJT - NPN | MOS |
| Node (nm) | 65 | 65 | 16 | 180 | 180 | 180 | 40 | 28 | 90 |
| Range | -40 to 110 | -40 to 110 | 10 to 90 | 0 to 50 | 0 to 100 | -40 to 85 | -40 to 125 | -20 to 130 | 20 to 130 |
| Area (mm²) | 0.01 | 0.01 | 0.015 | 0.044 | 0.09 | 0.09 | 0.00165 | 0.0038 | 0.00375 |
| VCC (V) | 1.2 | 1.2 | 0.7 | 1 | 1.2 | 1.8 | 1.05 | 1.1 | 1.3 |
| Power (µW) | 12.8 | 12.8 | 70 | 30 | 0.07 | 31 | 2500 | 17.6 | 910 |
| Conv Time (ms) | 0.08 | 0.08 | 1.6 | 7.5 | 31.25 | 32 | 1 | 0.03 | 0.1 |
| Rel. IA * | 3.8 | 1.4 | 2.5 | 9 | 2.9 | 0.24 | 1.3 | 2.4 | 1.1 |
| Resolution (mK) | 150 | 150 | 1000 | 40 | 300 | 3 | 240 | 500 | 200 |
| Energy (nJ) | 0.9 | 0.9 | 110 | 230 | 2.2 | 99 | 2500 | 0.56 | 91 |
| Trim | 1 | 2 | 2 | 1 | 2 | 3 | 1 | 0 | 2 |
| FOM (nJ*K²) | 0.02 | 0.02 | 110 | 0.36 | 0.2 | 0.0078 | 140 | 0.14 | 3.6 |

* Rel IA defined as in [6] = Inaccuracy (±3σ)*100/Range

TABLE 1

MINIATURIZED THERMISTOR BASED THERMAL SENSOR

FIELD OF THE INVENTION

The present invention relates generally to temperature sensors in integrated circuits, and particularly a miniaturized thermistor based thermal sensor.

BACKGROUND OF THE INVENTION

Integrated thermal sensors have been an important power management feature in Microprocessors, microcontrollers and other integrated circuits (ICs). One function of the sensors is to prevent overheating during operation in the most active areas of the chip, referred to as hot-spots. When these areas get too hot, the chip can "throttle" its frequency to a lower level, allowing it to cool down. In addition, the sensors have a catastrophic function, which is usually set to higher temperatures than the throttle point, at which point the entire computer platform is shut down to prevent permanent damage.

In the past, it was sufficient to have a small amount of sensors in a product. However, as products became multi-core, sensors were required in all of the cores, since each core could operate independently. This has led to an increase in the amount of thermal sensors per core, since there can be multiple hot-spots on each core, which are instruction dependent and difficult to predict during the early part of the design process. Another problem is heat dissipation. The dimensions of the chips have been reduced, but the thermal dissipation power has increased, making it much more difficult to cool the chips. This has led to an aggressive trend to decrease the size and power consumption of each sensor.

In addition to the hot-spot detection, it is important to measure the colder sections of the IC, due to the so-called ITD (inverse temperature dependence) effect: in older technologies and at nominal voltage levels, the frequency of the chip is reduced at higher temperatures, due to the reduction in mobility. However, as $V_{cc}$ scales down to lower voltages, the threshold voltage $V_{th}$ becomes more dominant than mobility. This can result in a lower frequency performance at lower temperatures. Under these conditions, the Power Control Unit (PCU) is required to detect the lowest temperature on the chip, in order to adjust $V_{cc}$ to maintain performance. Sensors are also used for fan regulation as well as power measurement.

For IC applications, most of the sensor inaccuracy is associated with calibration in the high volume testing environment, so it is sufficient to have a sensor whose total accuracy is ±0.5-1° C. at the hot calibration point and ±3° C. over the rest of the range. For these applications, it is not necessary to have ultra-high resolution (<0.05° C.), since any non-linearity associated with high volume manufacturing will likely be much higher than resolution limits. It is desirable to have a reduced energy consumption and reduced area. It is also desirable to have a relatively fast conversion time and latency, so that the sensor can give the PCU a quick reading when exiting deep sleep state, in which the sensor is disabled. The temperature gradients on a CPU can happen in 1-10 ms, so a conversion speed less than 1 ms is desirable.

There are a number of different mechanisms available for integrated temperature sensing, such as bandgap sensors based on the parasitic bipolar junction transistor (BJT). However, in leading edge processes, the BJT ideality factor may be compromised, which may lead to inaccuracies. A good alternative to BJT sensors are resistor (thermistor) based sensors. The temperature coefficient of resistivity (TCR) is nearly constant and several different types of resistors are available in CMOS. Such sensors tend to have lower energy consumption than other mechanisms. However, there have been very limited attempts in area reduction for this type of sensor.

SUMMARY

In the present invention, a novel reduced area (10,000 μm²) resistor-based thermal sensor is described, which may be implemented, for example, in 65 nm CMOS. This sensor is capable of an 80 μs conversion at a current of 10 μA and an energy consumption of 0.9 nJ. It is one of the smallest thermistor sensors yet reported, especially when considering the process node, and has one of the lowest energy consumptions.

BRIEF DESCRIPTION OF THE DRAWINGS

The present invention will be understood and appreciated more fully from the following detailed description taken in conjunction with the drawings in which.

DETAILED DESCRIPTION

In general, throughout the specification and claims, the term "connected" means a direct electrical connection between the things that are connected, without any intermediary devices. The term "coupled" means either a direct electrical connection between the things that are connected or an indirect connection through one or more passive or active intermediary devices. The term "circuit" or "circuitry" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

If a feature is described with the term "should" and the like, it means the patent is not limited to this feature.

Figure 1:
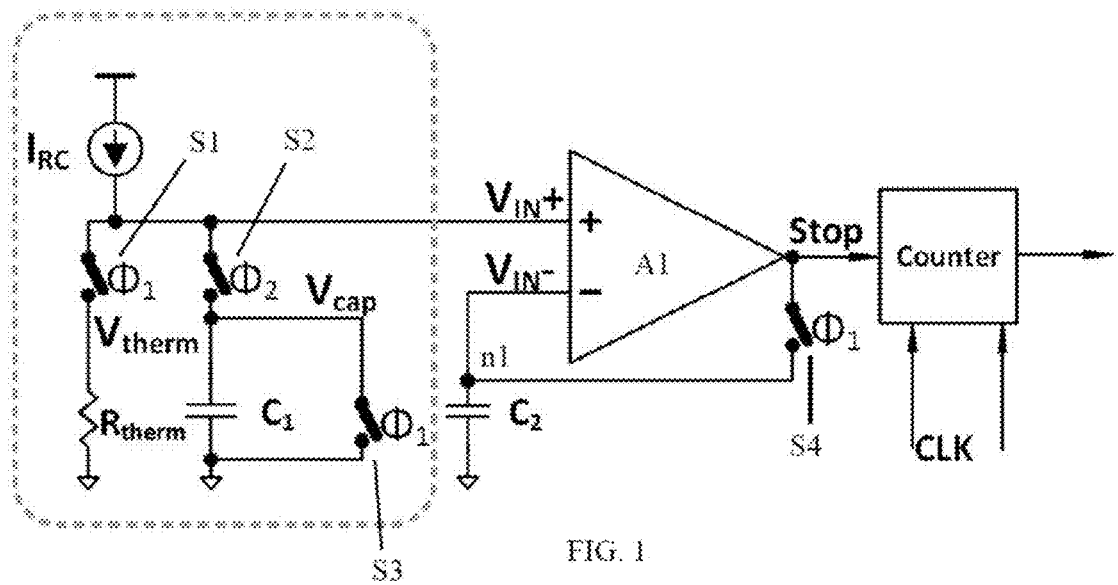
FIG. 1 is a schematic illustration of a thermal sensor, in accordance with a non-limiting embodiment of the invention.

Reference is now made to FIG. 1, which illustrates a schematic of a thermal sensor, in accordance with an embodiment of the invention.

The non-limiting circuitry of FIG. 1 is now described. This is a highly simplified version of the sensor. Further on, a more detailed version will be shown. A current source $I_{RC}$ is coupled to a first clock S1 having a phase $\Phi_1$ (the thermal signal generation phase), and to a second clock S2 having a phase $\Phi_2$ (the counting phase), and to a positive input $V_{in+}$ of an amplifier A1. The two clock phases, $\Phi_1$ and $\Phi_2$ are non-overlapping. The first clock S1 is coupled to a resistor $R_{therm}$ which is grounded. The second clock S2 is coupled to a capacitor C1 which is grounded. A third clock S3 having the phase $\Phi_1$ is coupled in parallel to capacitor C1. This portion of the circuitry is the RC bank biasing circuit.

A negative input $V_{in-}$ of amplifier A1 is coupled to a node n1, which is coupled to a second capacitor C2 and to a fourth clock S4, which has the phase $\Phi_1$ and which is coupled to an output of amplifier A1, which is coupled to the signal "Stop". The output "Stop" is coupled to an input of a counter. All switches S1-S4 are marked with the phase at which they are conducting.

As seen in the schematic, the operation of the thermal sensor of FIG. 1 includes two phases, the thermal signal generation phase ($\Phi_1$), and the counting phase ($\Phi_2$). During the first phase, the thermal signal generation phase ($\Phi_1$), the input current $I_{RC}$ flows through the thermistor $R_{therm}$ and generates a temperature dependent voltage $V_{therm}$:

$$V_{therm} = I_{RC} * R_{therm} \quad (1)$$

In the thermal signal generation phase ($\Phi_1$), the amplifier A1 is connected as a unity gain buffer, such that the output is connected to the negative input. A replica of this voltage (in series with any offset the amplifier might have) is sampled onto capacitor $C_2$, to generate the activation voltage for the next phase, which is the counting phase ($\Phi_2$):

$$V_{activation} = V_{therm} + V_{offset} \quad (2)$$

$V_{offset}$ is the inherent offset voltage in the amplifier, A1. During the first phase, the thermal signal generation phase ($\Phi_1$), the counter (at the output) is inactive, and capacitor $C_1$ is discharged to 0 V.

Following the sampling of $V_{activation}$, the thermal sensor is switched to the counting phase ($\Phi_2$), and the counter is enabled with a Start signal (not shown). During this phase ($\Phi_2$), the input current $I_{RC}$ is used to charge capacitor $C_1$, generating a ramp voltage over it:

$$V_{cap} = I_{RC} * \frac{T}{C_1} \quad (3)$$

where T represents elapsed time since the start of this phase ($\Phi_2$). In the counting phase ($\Phi_2$), the amplifier A1 works with no feedback, and thus operates as a comparator. Once $V_{in+}$ is larger than $V_{in-}$, the comparator will pull its output high, generating the "Stop" signal (shown in FIG. 1), and the counting will conclude, resulting in a digital code appearing on the counter which represents the temperature. The elapsed time T may be calculated according to the following equations:

$$V_{cap} + V_{offset} = V_{activation} \quad (4)$$

$$I_{RC} * \frac{T}{C_1} + V_{offset} = V_{therm} + V_{offset} \quad (5)$$

$$I_{RC} * \frac{T}{C_1} + I_{RC} * R_{therm} \quad (6)$$

$$T = R_{therm} * C_1 \quad (7)$$

The counter will be active for the time T, which is equal to the time constant resulting from the value of $C_1$ and the thermistor, $R_{therm}$. The time T is also seen to be independent of the value of the current $I_{RC}$, as long as it remains unchanged between the two phases. Since the resistance $R_{therm}$ is a function of temperature, so will be time T, as well as the digital output code of the counter.

Figure 2:
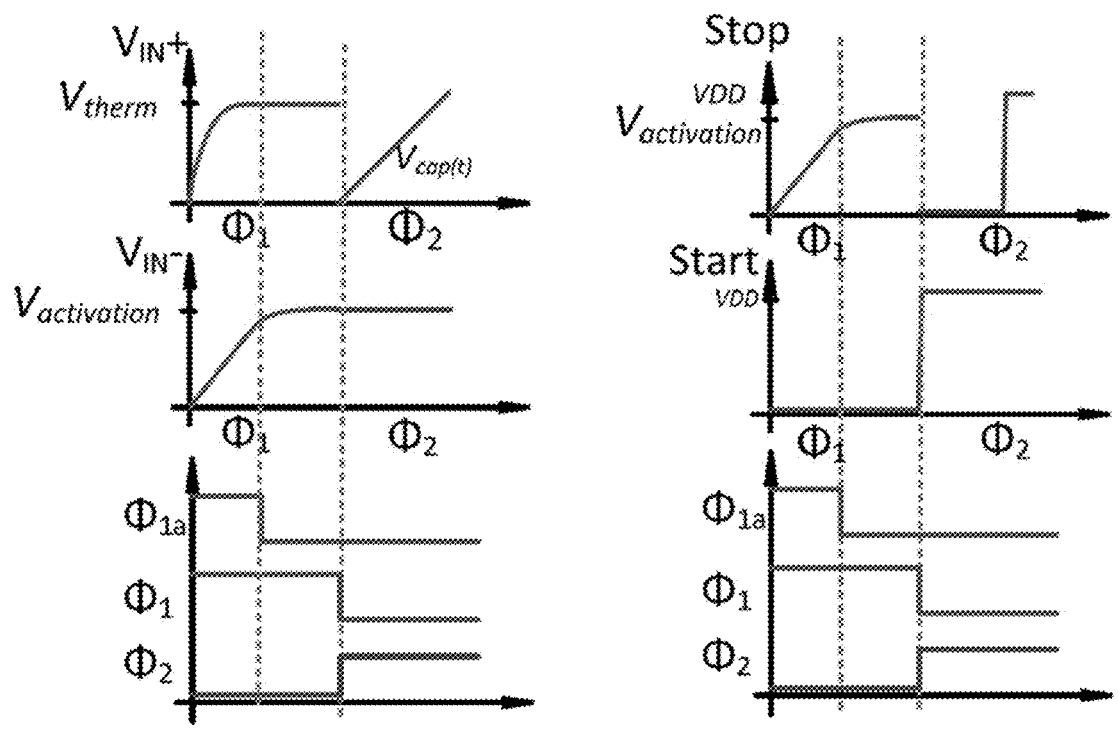
FIG. 2 is a graphical illustration of timing diagrams for critical nodes of the circuitry of FIG. 1.

The voltages $V_{therm}$ and $V_{activation}$ are shown in FIG. 2. (The clock phase $\Phi_{1a}$ shown in FIG. 2 is in the circuitry of FIG. 3A described below.)

The following is a non-limiting description of choosing the resistor and capacitor of the circuitry of FIG. 1.

In order to achieve maximal resolution, the counting time, T, should vary as much as possible in response to temperature change. For a given resistor type, the way to maximize its change with temperature is to use a high resistance value, which in turn occupies significant area. Assuming a linear relation of resistance and temperature, a resistor value as a function of temperature can be described by $$R_{temp} = R_{ref} + d\text{Temp}_{ref} * TCR * R_{ref} \quad (8)$$

$$R_{temp} = R_{ref} \text{delta} R(\text{temp-ref}) \quad (9)$$

Where $R_{ref}$ is the resistance value at a reference temperature, $d\text{Temp}_{ref}$ is the temperature change relative to the reference temperature, TCR is the Temperature Coefficient of Resistivity, and $R_{temp}$ is the resistance at the desired temperature. The second term in equation (8) is the change in resistance relative to the reference temperature.

From equations (7) and (9), it is clear that in order to maximize resolution the second term in equation (9) should be as large as possible. However, $R_{ref}$ holds no data of temperature, and will only make the measurement time longer. Therefore, optimal resistor selection for the temperature sensor of FIG. 1 is a resistor that offers maximal delta-R(temp-ref), with minimal $R_{ref}$ for a given area. To maximize sensitivity to the resistance change, the capacitor $C_1$ should also be made as large as possible.

Figure 3A:
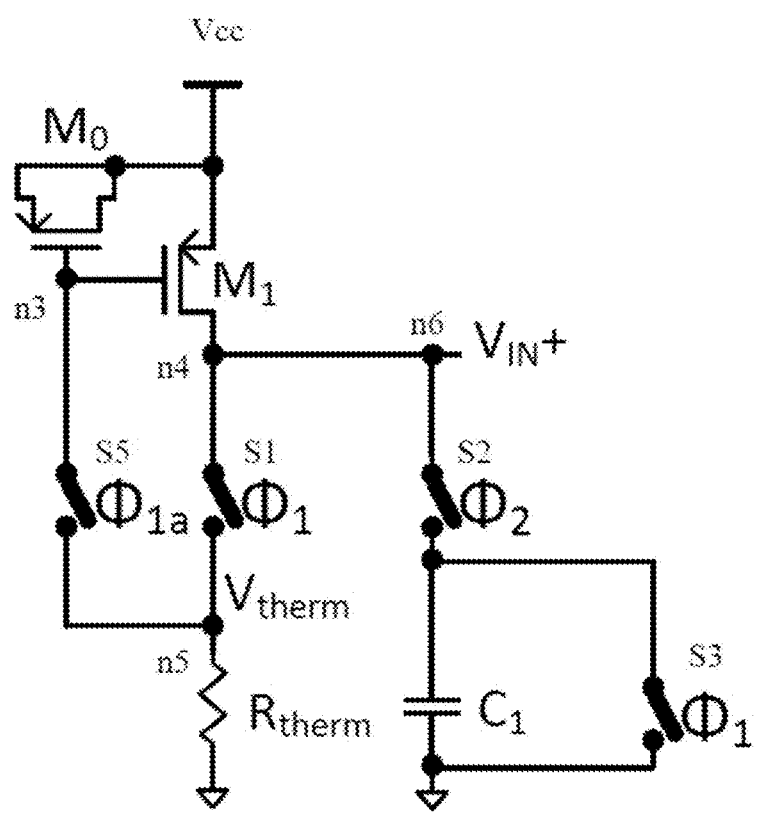
FIG. 3A is a schematic illustration of a biasing circuit for current input to the circuitry of FIG. 1, in accordance with a non-limiting embodiment of the invention.

Generation of Current Input to the Circuit—FIG. 3A

There are some challenges in generating an appropriate current $I_{RC}$. For example, the resistance value and temperature coefficient of resistance can vary significantly with different process techniques. Accordingly, the bias current should be adjusted according to the specific sensor and operating temperature. Otherwise the current source might become saturated at extreme resistance values.

To overcome this problem, a simplified biasing circuit is utilized, as is now described with reference to FIG. 3A.

In the circuitry of FIG. 3A, a PMOS transistor $M_0$ is connected as a MOS capacitor with its drain/source/bulk connected to Vcc. A gate of PMOS transistor $M_0$ is coupled to a gate of a PMOS transistor $M_1$ via a node n3. A source of PMOS transistor $M_1$ is coupled to Vcc and a drain of PMOS transistor $M_1$ is coupled to a node n4. A fifth clock S5 having a phase $T_{1a}$ is coupled to node n3 and to resistor $R_{therm}$ via a node n5. Node n4 is coupled to the first clock S1 having phase $\Phi_1$, and is coupled via a node n6 to the positive input $V_{in+}$ (of amplifier A1 of FIG. 1) and to the second clock S2 having phase $\Phi_2$. As before in FIG. 1, resistor $R_{therm}$ is grounded. The second clock S2 is coupled to capacitor C1 which is grounded. The third clock S3 having the phase $\Phi_1$ is coupled in parallel to capacitor C1. The timing of $\Phi_1$ $\Phi_{1a}$ and $\Phi_2$ are shown in FIG. 2.

Accordingly, in the circuit of FIG. 3A, during the first phase, i.e., the thermal signal generation phase ($\Phi_1$), the PMOS device $M_1$ is connected as a diode in series with the resistor $R_{therm}$ to allow current flow. In the counting phase ($\Phi_2$), the gate of PMOS device $M_1$ is disconnected with its voltage held by PMOS device $M_0$. This guarantees that the current through the PMOS device $M_1$ remain constant throughout the operation cycle of the thermal sensor.

The PMOS device $M_1$ is preferably a high-voltage device in order to limit the leakage through its gate and minimize current variations during the cycle. It is important to note that once the switch is disengaged, and the voltage is sampled onto $M_0$, charge injection and gate switching will generate an error in the sampled signal. This will in turn generate an error that might take a significant time to settle due to the high value and large parasitic capacitance of resistor $R_{therm}$. Therefore, the sampling switch is controlled from another phase $\Phi_{1A}$, which is limited to an early portion of the first phase $\Phi_1$ as shown in FIG. 2.

One major drawback of this circuit is the poor Power Supply Rejection Ratio (PSRR) due to the current being almost linearly dependent on the supply voltage. To mitigate this problem, the circuit can be modified to use an NMOS device for biasing instead of a PMOS. A simplified version of the circuit is shown and described with reference now to FIG. 3B.

Figure 3B:
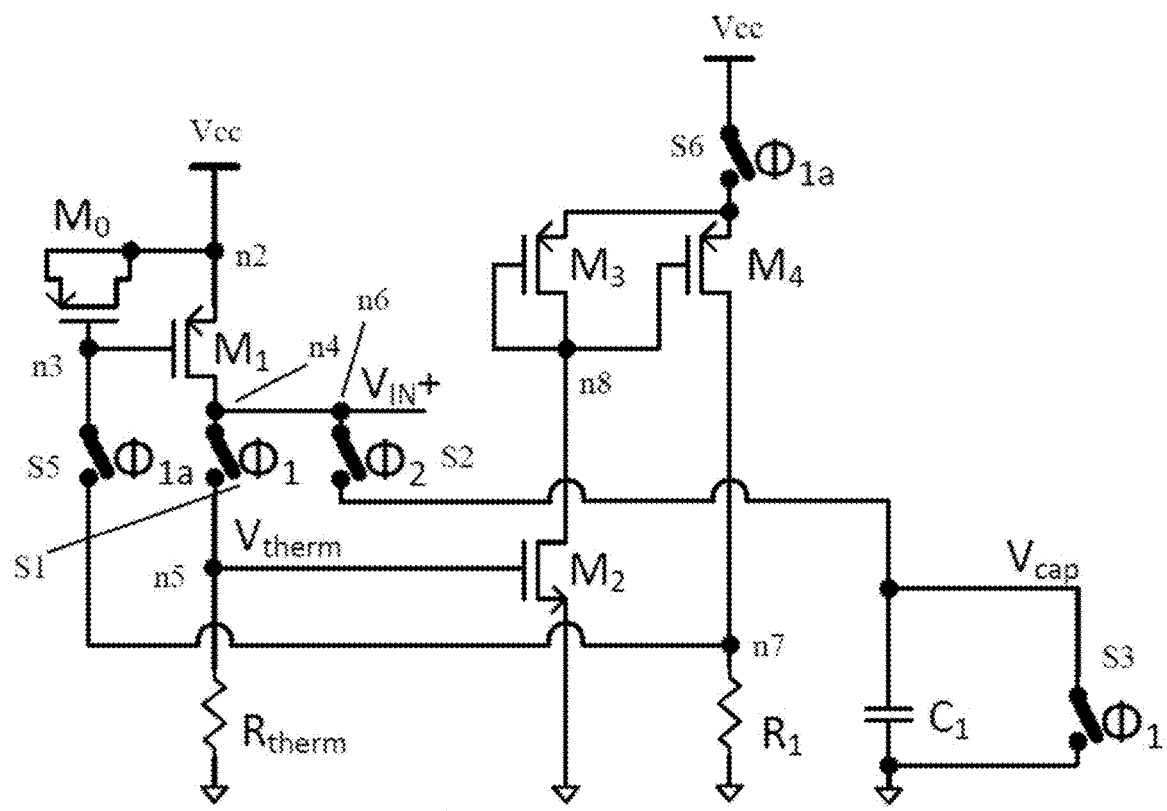
FIG. 3B is a schematic illustration of a biasing circuit for current input to the circuitry of FIG. 1, in accordance with a non-limiting embodiment of the invention, using NMOS transistors.

In the circuitry of FIG. 3B, the drain, source, and bulk of PMOS transistor $M_0$ are coupled to node n2, which is coupled to Vcc. The gate of PMOS transistor $M_0$ is coupled to the gate of PMOS transistor $M_1$ via node n3. The source of PMOS transistor $M_1$ is coupled to node n2 and its drain is coupled to node n4. The fifth clock S5 having the phase $\Phi_{1a}$ is coupled to node n3. Node n5 is coupled to resistor $R_{therm}$, which is grounded. The second clock S2 is coupled to capacitor C1 which is grounded. The third clock S3 having the phase $\Phi_1$ is coupled in parallel to capacitor C1. Node n4 is coupled to the first clock S1 having phase $\Phi_1$, and is coupled via node n6 to the positive input $V_{in+}$ (of amplifier A1 of FIG. 1) and to the second clock S2 having phase $\Phi_2$. Up till now, the circuit is the same as that of FIG. 3A.

In FIG. 3B, the fifth clock S5 having the phase $T_{1a}$ is not coupled to resistor $R_{therm}$ but instead is coupled to a resistor R1, which is grounded, via a node n7. Node n5 is coupled to a gate of an NMOS transistor $M_2$, whose source is grounded and whose drain is coupled to a node n8. Node n8 is coupled to a gate and a drain of a PMOS transistor $M_3$ and to a gate of a PMOS transistor $M_4$. A drain of PMOS transistor $M_4$ is coupled to node n7. The sources of PMOS transistors $M_3$ and $M_4$ are coupled to a switch S6 having the phase $\Phi_{1a}$. The PMOS transistors $M_3$ and $M_4$ form a current mirror.

The modification of the circuitry of FIG. 3B limits voltage changes over the resistor with supply variations by limiting $V_{therm}$ to the $V_{GS}$ of NMOS transistor $M_2$. This modification also benefits the amplifier A1 (FIG. 1) which measures $V_{in+}$, as will be explained further below.

The circuit of FIG. 3B places NMOS device $M_2$ inside a negative feedback loop which regulates the voltage $V_{therm}$. If the voltage $V_{therm}$ is higher than its equilibrium value, the current of NMOS device $M_2$ increases, thereby increasing the current in resistor $R_1$ by means of the current mirror $M_3$-$M_4$. This in turn reduces the over-drive voltage of PMOS device $M_1$, and pulls $V_{therm}$ lower, until it settles at the equilibrium point. The DC gain of the feedback loop is high enough to guarantee sufficient supply rejection at DC. The parasitic capacitance of $R_{therm}$ is used to limit the bandwidth (BW) of this loop and guarantee its stability. Once the $M_0$ gate voltage is sampled, the feedback loop is no longer required, and the currents in the $M_3$, $M_4$ branches are power-gated. Resistor $R_1$ is merely shown as an explicit resistor for simplicity. In practice, it can be implemented using any resistor, or can even be an equivalent output impedance of a transistor. Therefore, its area overhead is minimal.

The value of $V_{therm}$ is temperature dependent, since $V_{TH}$ and $V_{DSAT}$ of NMOS device M2 change with temperature. This in turn generates a change in $R_{therm}$ as its voltage varies relative to the die substrate, degrading linearity. However, this change in resistance is measured during calibration, and can therefore be nulled.

By using this resistor biasing scheme instead of a constant bias current, the simplified derivation of the time T that has been carried out earlier in equations (1)-(7) is somewhat modified. However, the final result remains the same. By redefining the charging current and the activation voltage $$V_{activation} = V_{GS(M2)} + V_{offset} \tag{10}$$

$$I_{RC} = \frac{V_{GS(M2)}}{R_{therm}} \tag{11}$$

$$V_{cap} = I_{RC} * \frac{T}{C_1} \tag{12}$$

by combining these new definitions, and solving for T $$V_{cap} + V_{offset} = V_{GS(M2)} + V_{offset} \tag{13}$$

$$I_{RC} * \frac{T}{C_1} = V_{GS(M2)} \tag{14}$$

$$V_{GS(M2)} * \frac{T}{R_{therm} * C_1} = V_{GS(M2)} \tag{15}$$

$$T = R_{therm} * C_1 \tag{16}$$

which in turn, is identical to equation (7).

To minimize error caused by the comparator, the sensor may use an amplifier in the signal path in both phases of operation. During the first phase, thermal signal generation phase ($\Phi_1$), this amplifier is used to buffer the signal before sampling, while during the second phase, counting phase ($\Phi_2$), it is used as the comparator. This scheme allows the offset to be cancelled as was shown earlier in equations (1)-(7) and (10)-(16). However, the amplifier and comparator modes have different requirements, which call for some modifications to the circuit between the two phases.

During the thermal signal generation phase ($\Phi_1$), the amplifier is used as a buffer in a negative feedback loop. Therefore, it should be stable under this operation condition, while achieving high gain to minimize error of the sampled signal. During the counting phase $\Phi_2$, while the counter is active, there is no stability limitation due to the open loop operation. However, in the counting phase, the amplifier should have a high slew rate or else the counter might be running for a longer time period than desired. It also requires a high gain in order to distinguish small input signals.

Figure 4A:
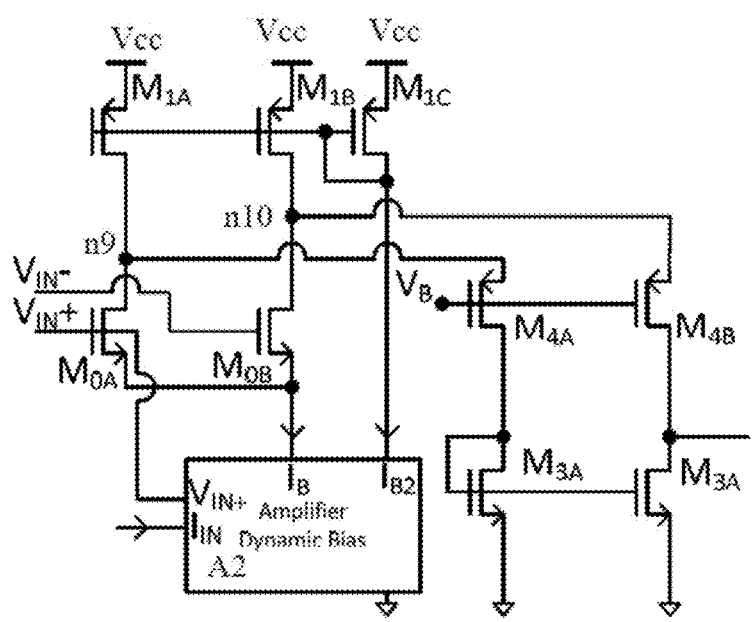
FIG. 4A is a schematic illustration of a folded-cascode amplifier for use with the circuitry of FIG. 1, in accordance with a non-limiting embodiment of the invention.
Figure 4B:
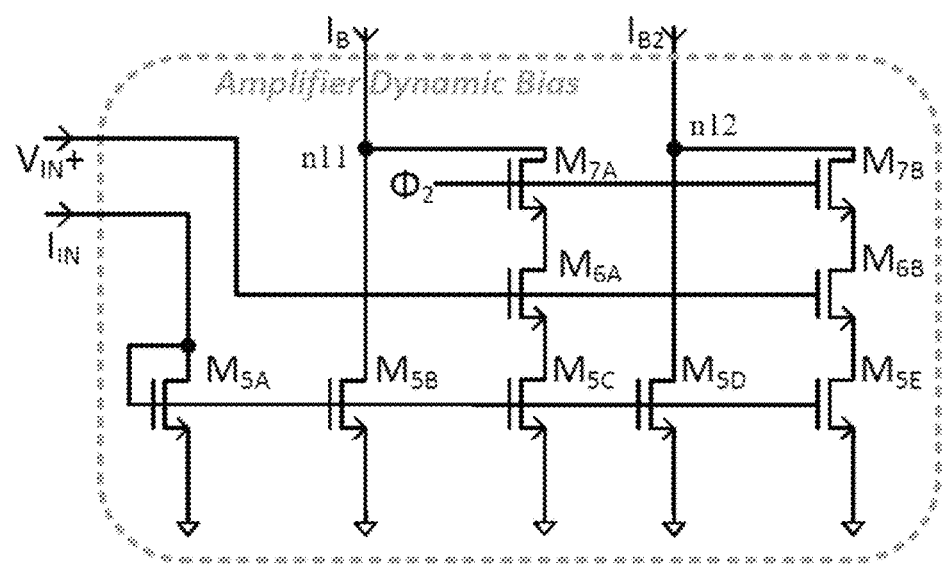
FIG. 4B is a schematic illustration of a dynamic biasing circuit for use with the circuitry of FIG. 1, in accordance with a non-limiting embodiment of the invention.

To meet these requirements, the sensor may use a folded-cascode amplifier (described in FIG. 4A) with a novel dynamic biasing circuit (described in FIG. 4B). An NMOS input pair (M0A and M0B, i.e., a differential pair) is used to maximize gm and minimize noise for a given current. The common mode (CM) input signal is guaranteed to be in the appropriate range for the input devices since the resistor biasing circuit of FIG. 3B uses a similar device type with higher $V_{dsat}$ when setting the comparator activation voltage, $V_{therm}$.

The circuitry of the folded-cascode amplifier of FIG. 4A is now described.

A source of a PMOS transistor $M_{1A}$ is coupled to Vcc and its drain is coupled to a node n9. A gate of PMOS transistor $M_{1A}$ is coupled to a gate of a PMOS transistor $M_{1B}$ and to a gate of a PMOS transistor $M_{1C}$. The sources of PMOS transistor $M_{1B}$ and of PMOS transistor $M_{1C}$ are coupled to Vcc. The gate and drain of PMOS transistor $M_{1C}$ are coupled to each other.

Node n9 is coupled to a drain of an NMOS transistor $M_{0A}$, whose gate is coupled to $V_{IN+}$ and whose source is coupled to a source of an NMOS transistor $M_{OB}$. A gate of NMOS transistor $M_{OB}$ is coupled to $V_{IN-}$ and a drain of NMOS transistor $M_{OB}$ is coupled to a drain of PMOS transistor $M_{1B}$ via a node n10. The source of NMOS transistor $M_{OB}$ is input as $I_B$ to a dynamic biasing circuit A2 with dynamic bias. The drain of PMOS transistor $M_{1C}$ is input as $I_{B2}$ to dynamic biasing circuit A2. The dynamic biasing circuit A2 also has inputs $V_{IN+}$ and $I_{IN}$.

Node n9 is coupled to a source of a PMOS transistor $M_{4A}$, whose gate is coupled to $V_B$ and whose drain is coupled to a drain and gate of an NMOS transistor $M_{3A}$, whose source is grounded and whose gate is coupled to a gate of an NMOS transistor $M_{3B}$, whose source is grounded. Node n10 is coupled to a source of a PMOS transistor $M_{4B}$, whose gate is coupled to $V_B$ and whose drain is coupled to a drain of NMOS transistor $M_{3B}$. $V_B$ is a biasing voltage.

The circuitry of FIG. 4B is now described.

The current $I_{IN}$ is coupled to a drain and a gate of an NMOS transistor $M_{5A}$, whose source is grounded. The current $I_B$ is coupled, via a node 11 to a drain of an NMOS transistor $M_{5B}$, whose source is grounded. Gates of NMOS transistors $M_{5A}$ and $M_{5B}$ are coupled to each other. Node n11 is coupled to a drain of an NMOS transistor $M_{7A}$, whose source is coupled to a drain of an NMOS transistor $M_{6A}$, whose source is coupled to a drain of an NMOS transistor $M_{5C}$, whose source is grounded. The current $I_{B2}$ is coupled, via a node 12 to a drain of an NMOS transistor $M_{5D}$, whose source is grounded. Node n12 is also coupled to a drain of an NMOS transistor $M_{7B}$, whose source is coupled to a drain of an NMOS transistor $M_{6B}$, whose source is coupled to a drain of an NMOS transistor $M_{5E}$, whose source is grounded. Gates of NMOS transistors $M_{7A}$ and $M_{7B}$ are coupled to each other. Gates of NMOS transistors $M_{6A}$ and $M_{6B}$ are coupled to each other and are also coupled to Vin+. Gates of NMOS transistors $M_{5A}$, $M_{5B}$, $M_{5C}$, $M_{5D}$ and $M_{5E}$ are coupled to each other. The counting phase ($\Phi_2$) is coupled to gates of NMOS transistors $M_{7A}$ and $M_{7B}$.

The amplifier biasing circuit of FIG. 4B has two parallel paths; one supplies a very low current, while the other supplies a much higher current. During the first phase of operation, the thermal signal generation phase ($\Phi_1$), the high current path is disabled by control $\Phi_2$ (only high during the second phase of operation, which is the counting phase), which guarantees stability and conserves power. For the second phase (the counting phase), $\Phi_2$ is asserted and the high current path can be activated. However, the high current path is only needed when the input signal approaches the activation voltage, which accounts for a short portion of this phase. As the activation voltage was set to $V_{GS(M2)}$ by the RC bias circuit of FIG. 3B, a single device of similar type with lower $V_{dsat}$ can be used as a simple detector, conducting when the input signal approaches the activation voltage. These pre-comparators are marked in the schematic as $M_{6A}$ and $M_{6B}$. The amplified biasing circuit has two similar portions, to bias both the NMOS ($I_B$) and the PMOS ($I_{B2}$) devices of the folded-cascode amplifier. $I_{in}$ is a reference current, which, in this implementation, is derived from the RC bank biasing circuit, by mirroring the current of $M_1$ of FIG. 3B (not shown).

The counter may be implemented as a ripple counter to maintain simplicity while minimizing switching activity. To increase resolution for a given input clock, it can count on both clock edges, with the ability to count on a single edge if a faster clock is available and local power conservation is more important. In order to ensure digital levels at the input of the counter connected to the amplifier's output, its input can be gated during the first phase where the amplifier output is at $V_{activation}$.

Noise and Offset Considerations

As described above, the operation of the thermal sensor cancels amplifier offset, as it remains correlated between the two samples. In practice, the offset of the amplifier can change between the two operating phases, due to change in amplifier bias current and therefore $V_{dsat}$. However, the most dominant source of mismatch in differential amplifiers is $V_{TH}$ mismatch of the input devices. Therefore, the offset voltage of the amplifier will remain mostly unchanged between phases, which will guarantee the effectiveness of the offset cancellation.

Noise which is at frequencies that are significantly lower than the operating frequency of the sensor, such as 1/f noise of the amplifier and current source, will be attenuated. This can be understood by treating these frequencies similarly to the offset voltage, as they are correlated between operating phases of the sensor. This also holds true for sampling noise over capacitor $M_0$ of FIG. 3B, which relaxes area requirements. In practice this will only be effective for frequencies up to a few kHz, while for small devices 1/f corner frequency can be as high as tens or even hundreds of kHz. Therefore, unless very large devices are used for the amplifier and current source, 1/f noise cannot be neglected. This poses a tradeoff between area and resolution of the sensor.

To achieve sufficient resolution, $R_{therm}$ and $C_1$ should be of high value. As a result, $R_{therm}$ will also have significant parasitic capacitance associated with it. Therefore, thermal noise generated by both $R_{therm}$ as well as $I_{RC}$ should be low pass filtered before passing through the amplifier for both phases of the sensor operation.

The noise of the amplifier/comparator should also be taken into consideration for both phases of the circuit operation. During $\Phi_1$ the amplifier is operating with low transconductance (gm), and a capacitive load at the output. This capacitor will limit BW, and as a result integrated noise. However, increasing the capacitance will result in increased area. Therefore, similar to the 1/f noise, there is a tradeoff between area and resolution. During $\Phi_2$, the noise of the comparator can only be taken into consideration as it approaches the activation voltage. At this time, it is operating with high current resulting in high gm, but without the capacitive load of the first phase to limit its bandwidth. To limit the total noise of the comparator its bias current should be increased, resulting in a tradeoff between power and resolution.

Finally, another source of noise to be considered is clock jitter for the counter. To do this one should first relate clock jitter and input signal, which in this case is temperature. This can be done by finding the change in measurement time, T, for a given changed in temperature, for instance 1 C.

$$\text{delta-}T(1\ C) = \text{delta-}R_{therm}(1\ C) * C_1 \qquad (17)$$

One can use equation (15) to calculate the allowed RMS clock jitter by defining the RMS error that is acceptable for the application $$\text{Jitter(CLK)} = \text{delta-}T(1\ C) * \text{Temp}_{error} \qquad (18)$$

where $\text{Temp}_{error}$ is the RMS error expressed in degrees C. For a sensor implementation in one non-limiting embodiment of the invention, delta-T(1 C) for the nominal case is equal to 35 ns. Therefore, for a measurement error of 0.01 C, an integrated clock jitter of 350 ps can be tolerated over the counting period of 25 μs.

Measurement Results

Figure 5:
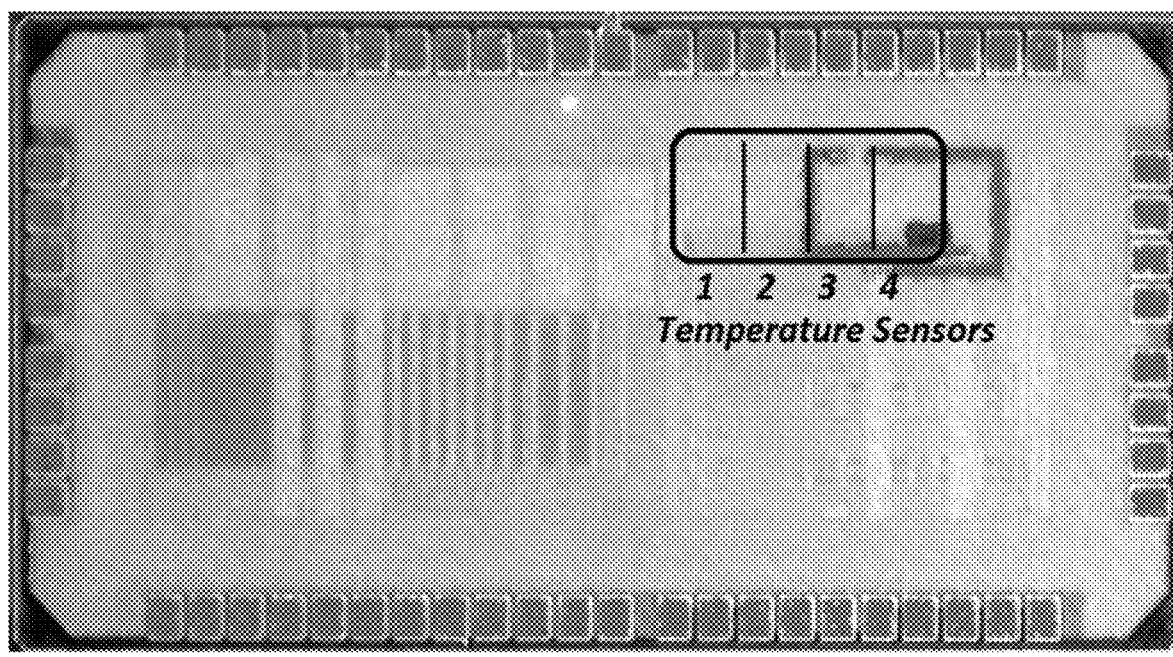
FIGS. 5 and 6 are illustrations of a chip micrograph and sensor layout, respectively, in accordance with one non-limiting embodiment of the invention.
Figure 6:
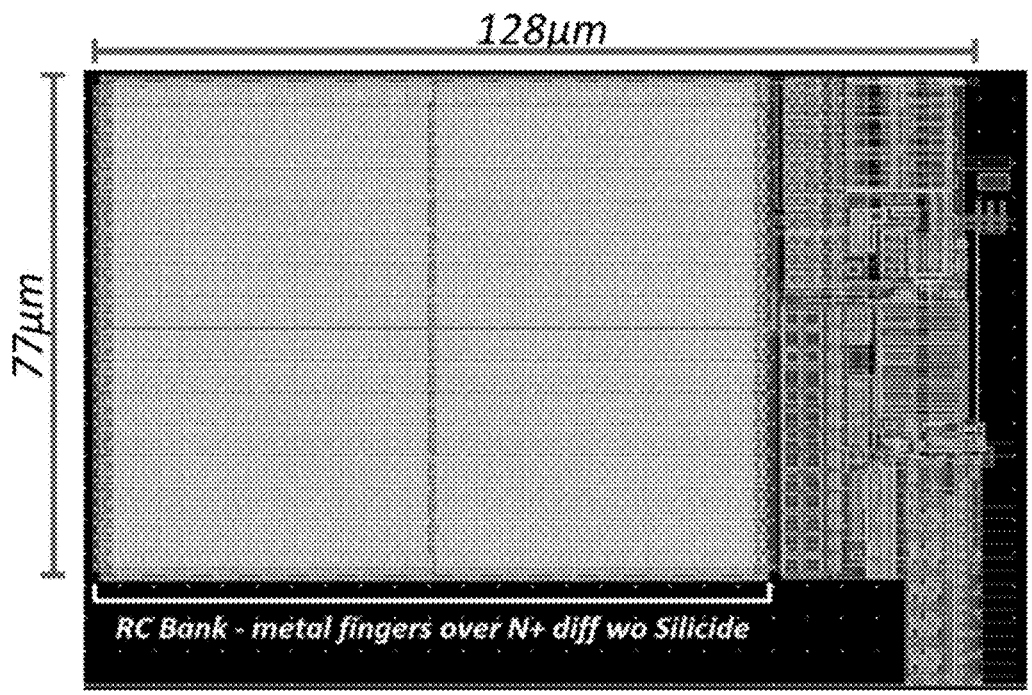

The sensor may be fabricated in 65 nm CMOS technology. A chip micrograph and sensor layout, in accordance with one non-limiting embodiment of the invention, are shown in FIGS. 5 and 6 respectively. Each test chip includes four (4) independent sensors, with an independent amplifier, biasing circuit, and counter, as well as accompanying logic. Each sensor occupies an active die area of 0.01 mm$^2$; about 75% of the area is occupied by the thermistor and capacitor that is placed in metal layers above it. Each sensor consumes an average current of 10.7 μA from a 1.2 V supply at room temperature. The sensors were supplied with a 100 MHz clock for counting, and at this clock speed with dual edge counting, a least significant bit (LSB) for the nominal corner equals approximately 140 mK. Measurement was done by placing the entire measurement board in a temperature-controlled oven (VOTSCH VT7004). To limit temperature variations of the test chip, it was thermally coupled to an aluminum block inside the oven.

Figure 7A:
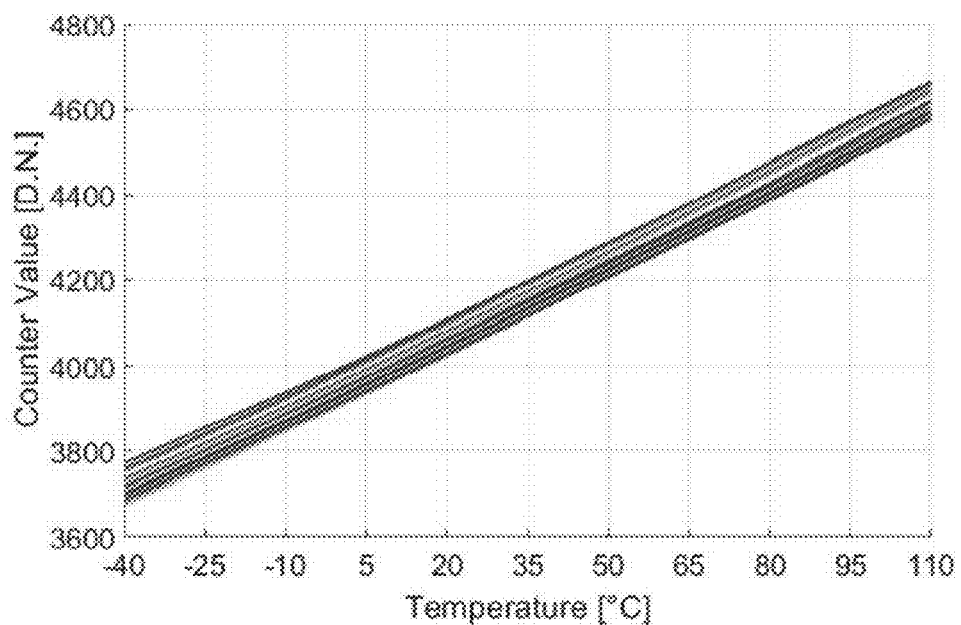
FIG. 7A is a graphical illustration of raw output from a counter of the thermal sensor.

FIG. 7A illustrates the raw output from the counter for 20 sensors. The main source of spread between sensors is the value of the time constant $R_{therm}*C_1$. Therefore, to normalize the value of this time constant across temperature, using a single point of calibration, the output code should be multiplied by the appropriate factor. This factor can be calculated as the ratio of the counter value at the calibration point and the value of the reference sensor at the same temperature. However, additional errors such as non-linearity, and delay variations of the comparator may result in the single point calibration being limited. If two points of calibration are available, the error can be made smaller by correcting for both the offset and the average slope of the figure.

Figure 7B:
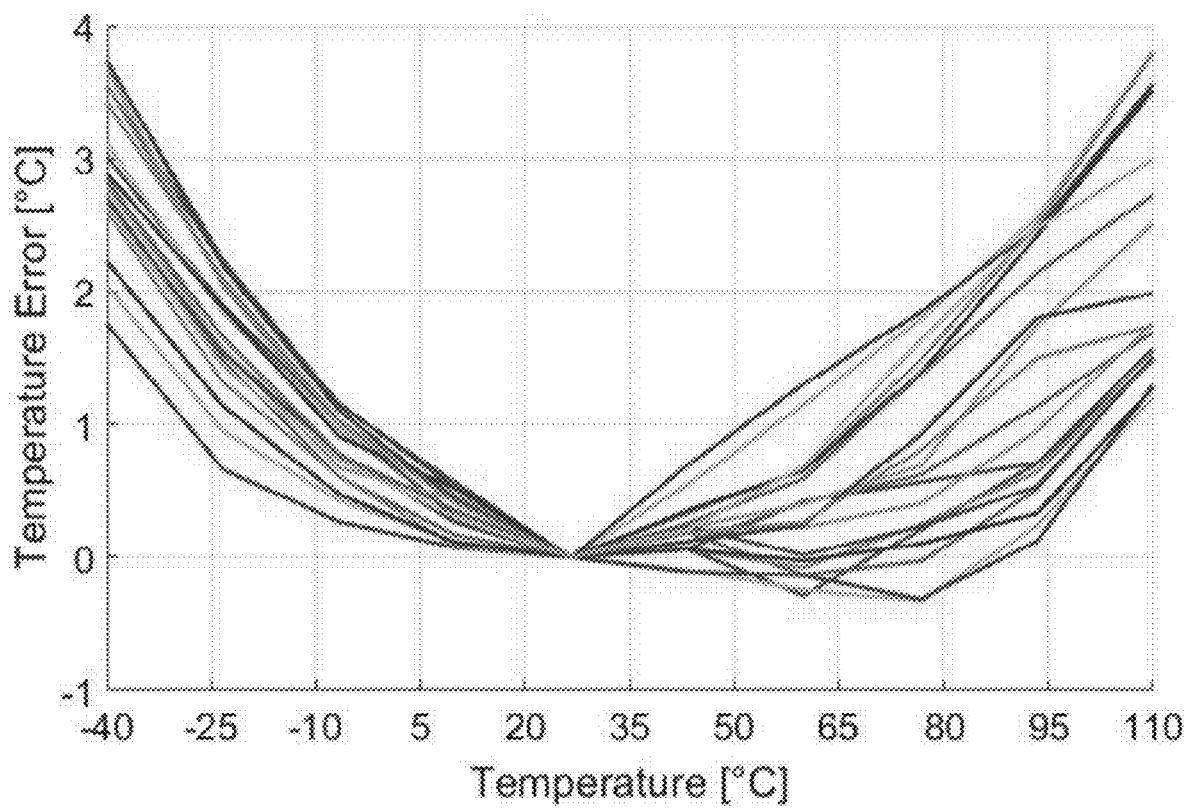
FIGS. 7B and 7C are graphical illustrations of the error of the thermal sensor, using single and dual point calibration for the ranges of −40-110° C., respectively.
Figure 7C:
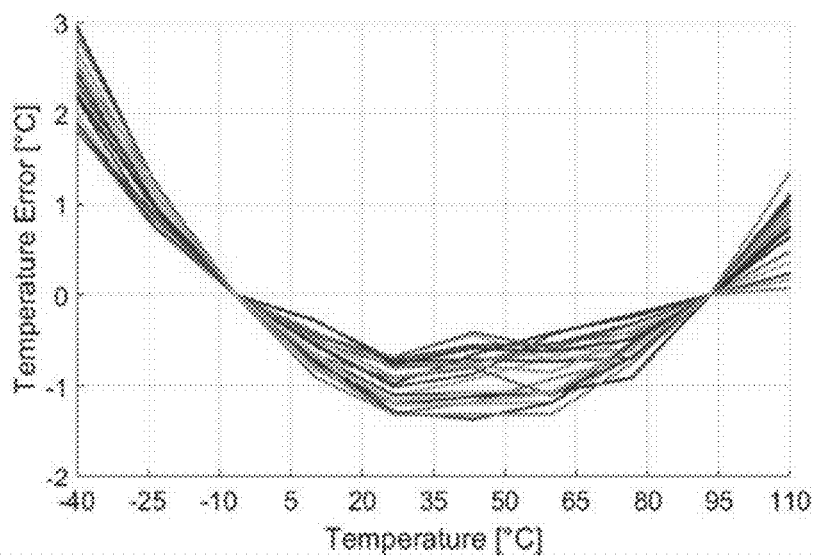
Figure 8A:
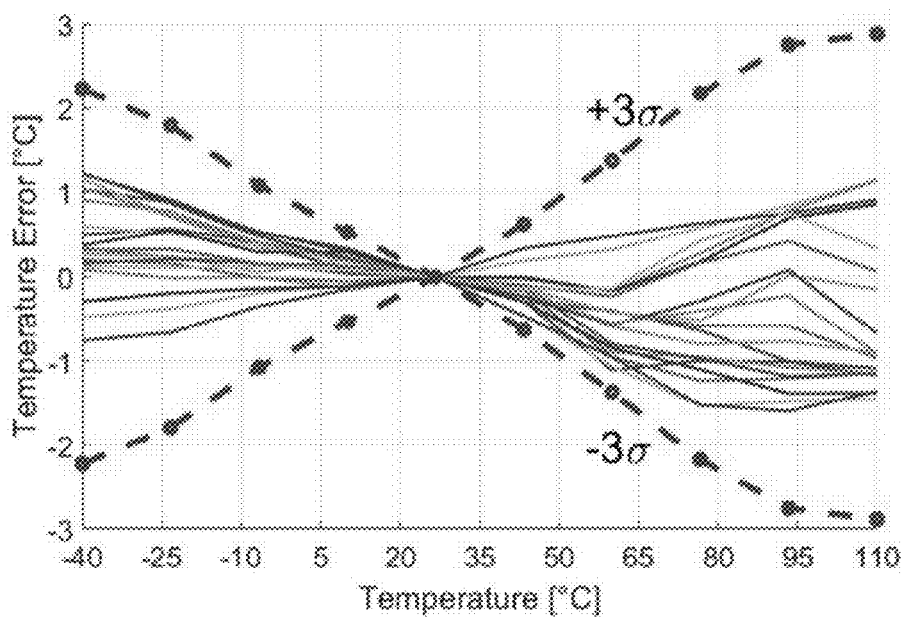
FIGS. 8A and 8B are graphical illustrations of the measured sensor error, using single and dual point calibration, respectively.
Figure 8B:
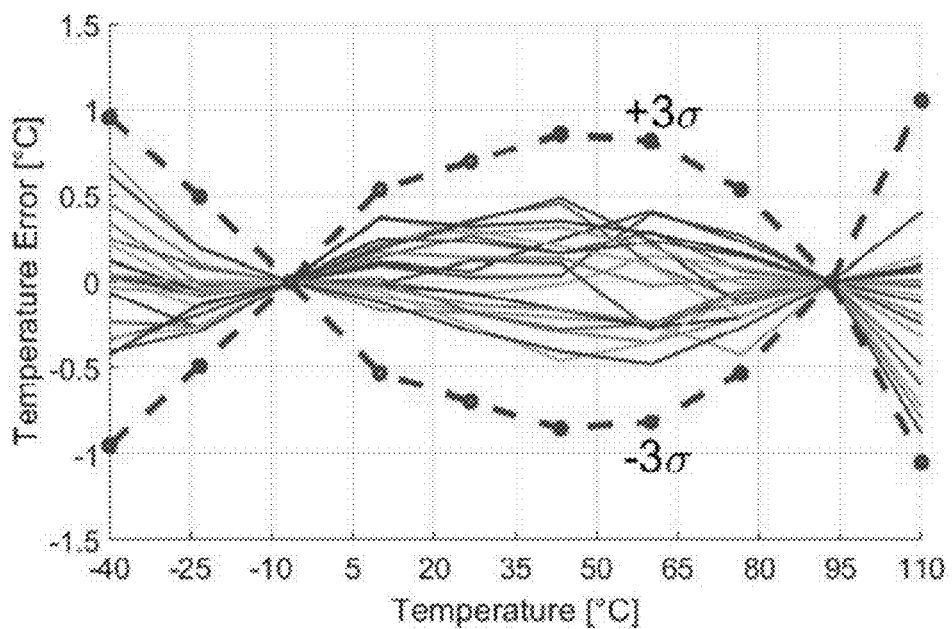

FIGS. 7B and 7C illustrate the error using single and dual point calibration for the ranges of −40 C-110° C., respectively. As can be easily recognized, both figures show significant second order non-linearity, causing an error of as much as 4° C. for single point calibration and 3° C. for two points calibration. This non-linearity can also be observed in circuit simulation, and its cause is the second order temperature coefficient of the thermistor. This non-linearity is very similar between sensors, and can therefore be nulled. This may be done in manufacturing by measuring the second order coefficient for several hundred units and applying this coefficient to the entire production, which can be in the millions. To replicate this approach, one measured the coefficient for the first four sensors, and applied it to the rest. This is shown in FIGS. 8A and 8B for 1-point and 2-point calibration respectively.

Figure 9A:
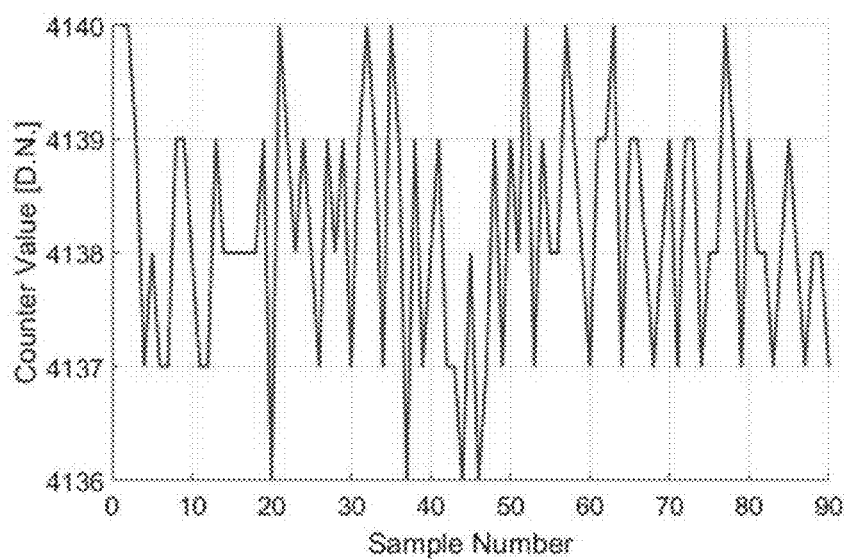
FIG. 9A is a graphical illustration of the measured sensor count for consecutive readings at 26° C.
Figure 9B:
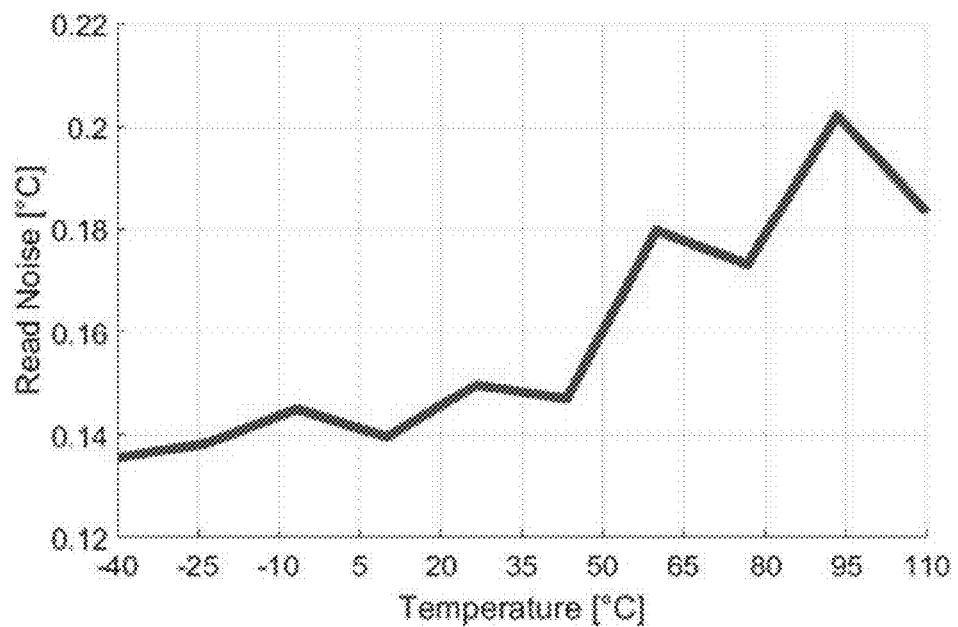
FIG. 9B is a graphical illustration of the measured RMS noise vs. temperature.

To verify the effective resolution of the sensors, 90 consecutive readouts have been carried out at each temperature, and the RMS value calculated. The output code for 90 consecutive readouts at 26° C. is shown in FIG. 9A. The RMS noise calculated based on similar plots for each of the 20 sensors, for the complete range of temperatures is presented in FIG. 9B. Readout noise increases with temperature, limiting effective resolution at higher temperatures. For room temperature the effective resolution is approximately 150 mK.

Figure 10:
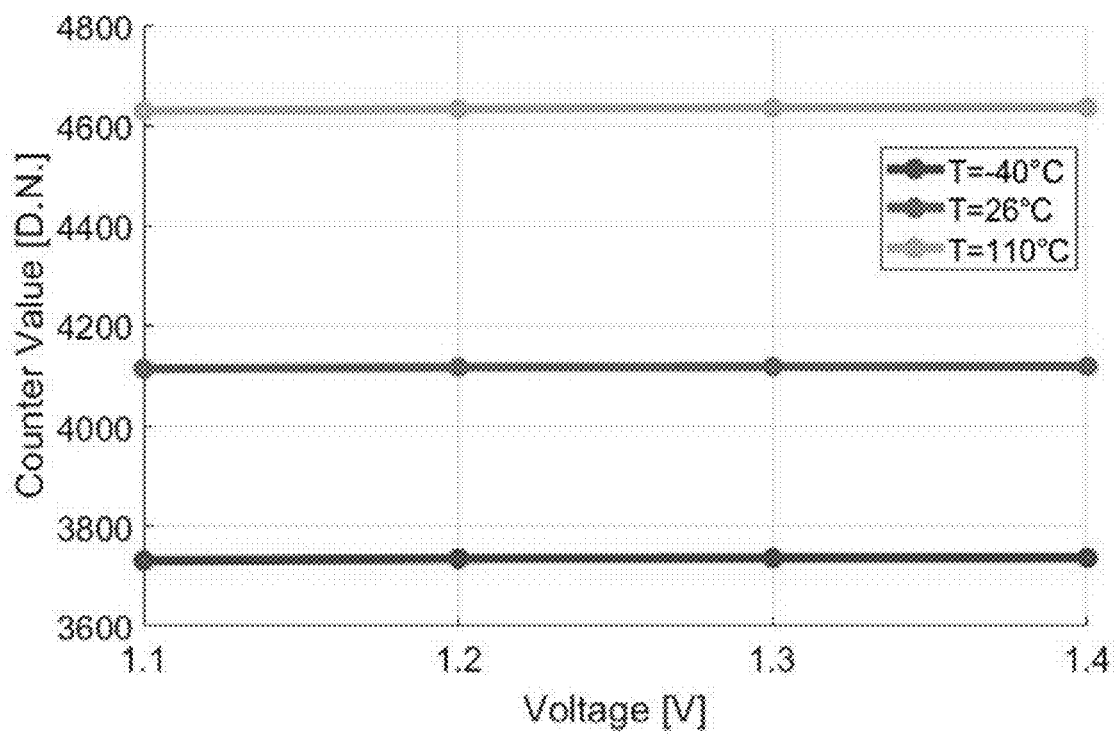
FIG. 10 is a graphical illustration of the supply sensitivity at three different temperatures for Vcc between 1.1-1.4 V.

FIG. 10 illustrates the supply sensitivity at three different temperatures for Vcc between 1.1-1.4 V. The supply sensitivity at the nominal supply (1.2V) is less than 0.003° C./mV.

Figure 11:
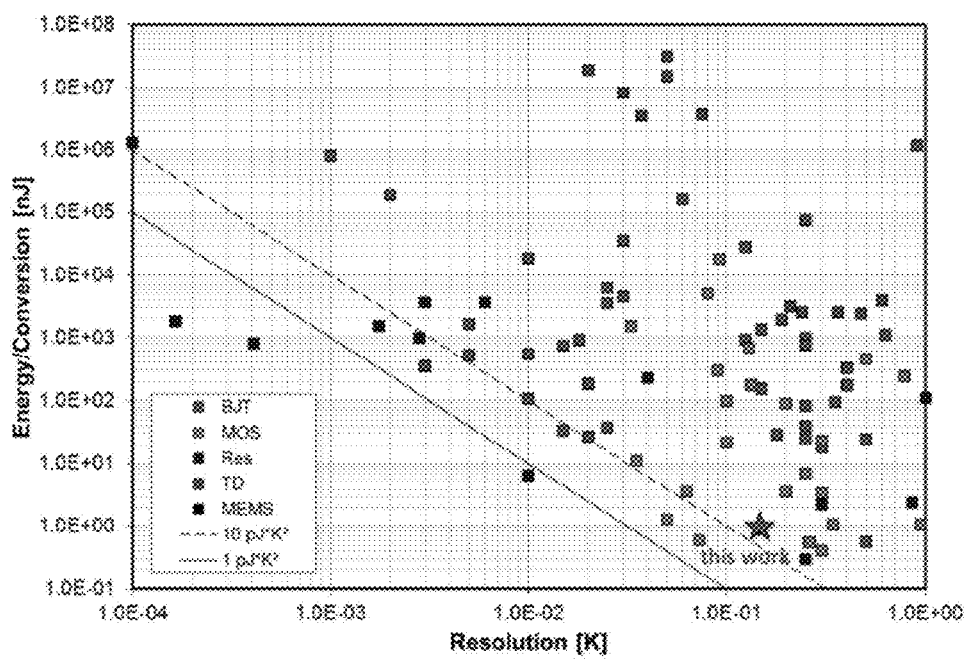
FIG. 11 is a graphical illustration of resolution/energy comparison to prior art.
Figures 12, 12A:
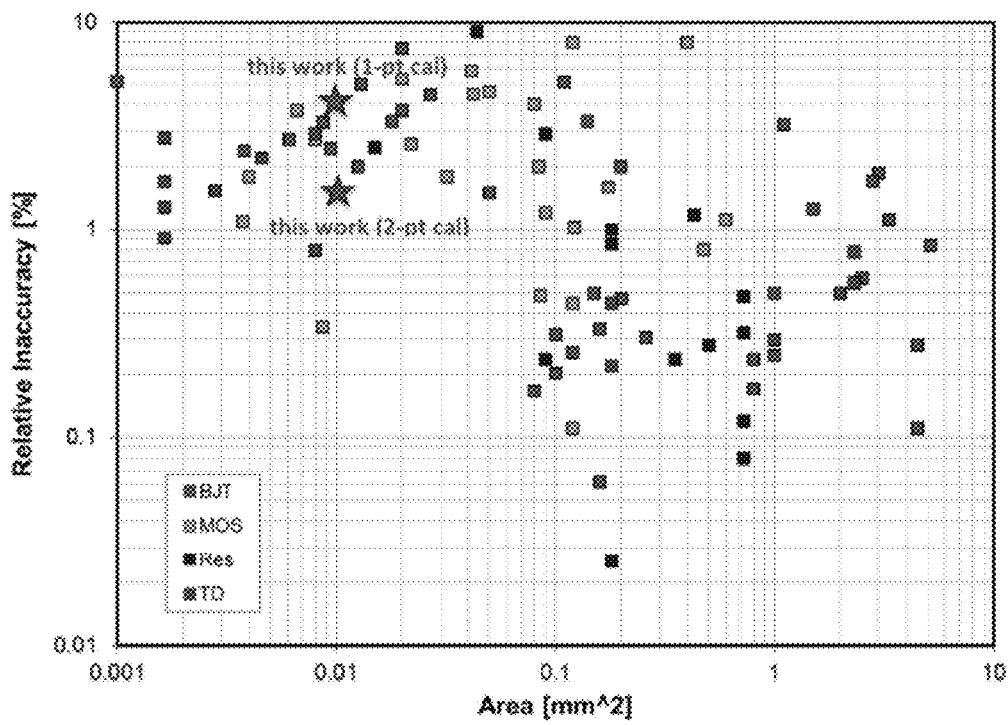
FIG. 12 is a graphical illustration of area and accuracy comparison to prior art.
FIG. 12A illustrates Table 1 which compares the thermal sensor of the invention to some prior art resistor-based sensors.

Table 1 (FIG. 12A) compares this sensor to some of the smallest resistor-based sensors found in K. A. A. Makinwa, "Temperature Sensor Performance Survey," [Online]. Available: http://ei.ewi.tudelft.nl/docs/TSensor_survey.xls [herein Makinwa], as well as smallest sensors based on BJT's, thermal-diffusivity, and MOS devices. The sensor of this work offers the most compact area out of all resistor-based sensors in Table 1 and fastest sample time of all resistor based sensors. A more comprehensive comparison to prior-art can be seen in FIG. 11 which compares energy and resolution, and FIG. 12 which compares relative error and sensor area (copied with permission from Makinwa).

Possible Circuit Modification for Reduced Area

The thermal sensor, in accordance with a non-limiting embodiment of the invention, occupies an area of 0.01 mm$^2$, which is one of the smallest resistor-based sensors published to date. However, given a few tradeoffs, the circuit can be made even smaller. Over 75% of the circuit area is occupied by the RC bank, and therefore, minimizing its area can yield significant area savings. One possible modification that reduces area is reduction of the time constant $R_{therm}*C_1$. For example, by reducing size of the bank by 50%, the sensor can be shrunk down to approximately 0.006 mm$^2$. However, by doing so, the time constant $R_{therm}*C_1$, as well as parameter delta-T(1 C) will be 4 times smaller, which will lower the resolution.

Another possible solution to this problem would be using a current mirror with ratio of n:1 between the current of the resistor $R_{therm}$ and the capacitor $C_1$. For example, by using a mirror of 4:1, the sensor area can be shrunk down to approximately 0.006 mm$^2$, while keeping similar delta-T(1 C) as in the current circuit. However, this current mirror might cause non-linearity, and increased noise. This possible circuit modification is shown in FIG. 13.

Figure 13:
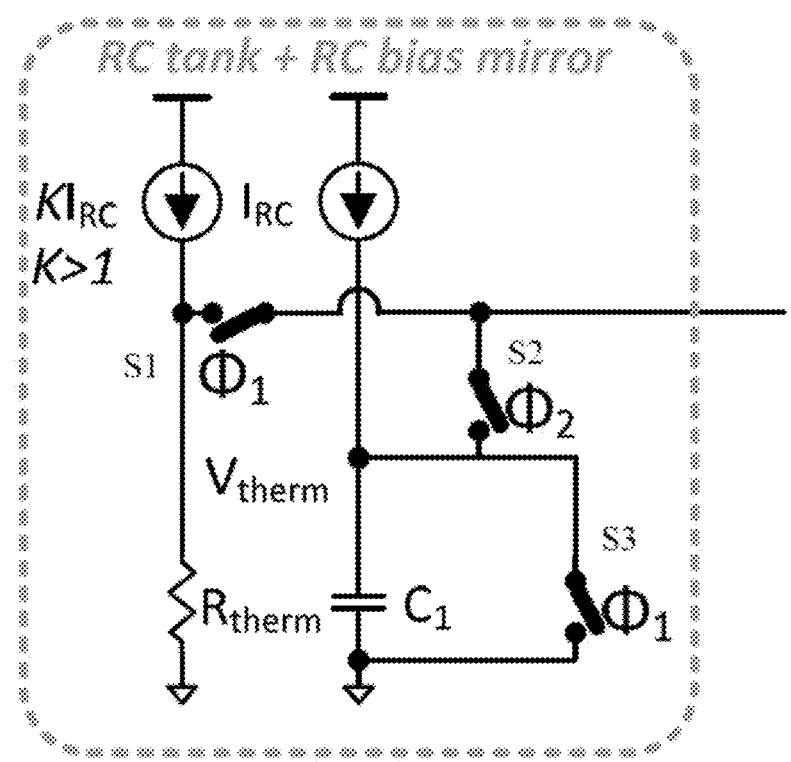
FIG. 13 is a schematic illustration of a current mirror for use in the thermal sensor, in accordance with one non-limiting embodiment of the invention.

The non-limiting circuitry of FIG. 13 is now described. A current source $KI_{RC}$ is coupled to first clock S1 having phase $\Phi_1$. First clock S1 is coupled to second clock S2 having phase $\Phi_2$. The first clock S1 is coupled to resistor $R_{therm}$ which is grounded. Current source $I_{RC}$ is coupled to capacitor $C_1$ which is grounded. Third clock S3 having the phase $\Phi_1$ is coupled in parallel to capacitor $C_1$. The second clock S2 having phase $\Phi_2$ is coupled to the third switch S3. Parameter K represents the current ratio between the two current sources charging $R_{therm}$ and $C_1$. The current source charging $R_{therm}$ is K times that charging C1.

In conclusion, in some embodiments, the thermal sensor uses an N+− diffusion thermistor with a metal capacitor to generate a temperature dependent RC time constant. The time constant may be measured using a novel amplifier/comparator combination, with a power saving dynamic bias. The circuit exhibits a resolution FOM (figure of merit) of 0.02 (nJ-$K^2$), and the fastest sample time in its category (80 μs). It also has one of the lowest energy consumptions of any sensor published. This circuit is fairly insensitive to the clock jitter. Furthermore, since most of the area is in the passives, it is expected that the sensor size will scale with technology. The combination of compact area, speed, and competitive resolution-FOM make this sensor suitable for CPU applications where thermistor based sensors are generally not utilized.

The invention claimed is:

1. A thermal sensor comprising:
a first resistor and a first capacitor, said first resistor being a thermistor;
a first current source coupled to said first resistor and said first capacitor that alternately charges said first resistor and said first capacitor each to a reference voltage, $V_{therm}$, and wherein an output of said thermal sensor is a function of a resistance-capacitance (RC) time constant of said first resistor and said first capacitor;
two non-overlapping phases, a thermal signal generation phase Φ1 and a counting phase Φ2, wherein in the thermal signal generation phase Φ1, said first current source charges said first resistor to reference voltage $V_{therm}$ and discharges said first capacitor to ground, while in the counting phase Φ2, said first current source charge said first capacitor to $V_{therm}$; and
wherein said first current source is coupled to a first clocked switch S1 clocked with a clock signal having the thermal signal generation phase $\Phi_1$, and to a second clocked switch S2 clocked with a clock signal having the counting phase $\Phi_2$, and to a positive input $V_{in+}$ of an amplifier A1, and wherein the first clocked switch S1 is coupled to said first resistor which is grounded and wherein said second clocked switch S2 is coupled to said first capacitor which is grounded, and wherein a third clocked switch S3 clocked with a clock signal having the thermal signal generation phase phase $\Phi_1$ is coupled in parallel to said first capacitor, and wherein a negative input $V_{in-}$ of said amplifier A1 is coupled to a node n1, which is coupled to a second capacitor and to a fourth clocked switch S4, clocked with a clock signal having the thermal signal generation phase $\Phi_1$, and which is coupled to an output of said amplifier A1, which outputs to a counter.

2. The thermal sensor according to claim 1, wherein said thermal signal generation phase Φ1 and said counting phase Φ2 are non-overlapping phases.

3. The thermal sensor according to claim 1, wherein a time it takes to charge said first resistor and said first capacitor to $V_{therm}$ is proportional to temperature.

4. The thermal sensor according to claim 1, further comprising a comparator, wherein in the thermal signal generation phase Φ1, voltage on said first resistor is stored on said second capacitor and in the counting phase Φ2, voltages on said first and second capacitors are input to first and second inputs of said comparator, respectively, which trips when the voltages on said first and second capacitors are equal, such that time it takes to trip is proportional to temperature measure by said thermal sensor.

5. The thermal sensor according to claim 4, wherein in the thermal signal generation phase Φ1, aid comparator receives $V_{therm}$ at said first input and is connected as a unity gain buffer with its output and said second input connected to each other and to said second capacitor, and wherein in the counting phase $\Phi_2$, the output of said comparator is disconnected from said second input and said second capacitor.

6. The thermal sensor according to claim 5, further comprising a feedback loop which receives $V_{therm}$ in the thermal signal generation phase $\Phi_1$ and controls the current in said first current source.

7. The thermal sensor according to claim 6, wherein said first current source is a PMOS transistor whose source is coupled to a positive supply, and wherein an input to said feedback loop is a gate of an NMOS transistor which produces a second current which is mirrored into a first port of a second resistor, said first port of the second resistor being coupled to a gate of the first current source.

8. The thermal sensor according to claim 7, wherein said comparator comprises two biases and a differential pair, a static bias generated by a third current source and a dynamic bias generated by a fourth current source, wherein the static bias is conducting in both the thermal signal generation phase and the counting phase and the dynamic bias in conducting only in the counting phase, wherein the output of the two biases are coupled to each other and provide current to the differential pair.

9. The thermal sensor according to claim 8, wherein the third and fourth current sources are NMOS transistors and the fourth current source is coupled to an NMOS transistor which is connected to the first input of said comparator.

10. The thermal sensor according to claim 1, wherein the first current source comprises a fifth current source and a sixth current source wherein the fifth current source is a multiple of the sixth current source, and the fifth current source charges the first resistor in the thermal signal generation phase and the sixth current source charges the first capacitor in the counting phase.

* * * * *